United States Patent [19]

Grabmaier et al.

[11] 4,357,201
[45] Nov. 2, 1982

[54] METHOD FOR PRODUCING PLATE-, TAPE- OR FILM-SHAPED SI CRYSTAL BODIES FOR SOLAR CELLS

[75] Inventors: Christa Grabmaier, Berg; Heinz Holzapfel, Augsburg, both of Fed. Rep. of Germany

[73] Assignee: Siemens Aktiengesellschaft, Berlin & Munich, Fed. Rep. of Germany

[21] Appl. No.: 261,921

[22] Filed: May 8, 1981

[30] Foreign Application Priority Data

May 22, 1980 [DE] Fed. Rep. of Germany ....... 3019635

[51] Int. Cl.$^3$ ............................................. C30B 29/06
[52] U.S. Cl. .................................... 156/603; 156/605; 156/DIG. 64; 264/63; 264/66; 29/572; 427/74; 427/85; 427/86; 427/202; 427/203
[58] Field of Search ................... 427/202, 203; 74, 85, 427/86; 29/572; 264/63, 66; 156/603, 605, DIG. 64

[56] References Cited

U.S. PATENT DOCUMENTS

| | | | |
|---|---|---|---|
| 2,904,613 | 9/1959 | Paradise | 136/250 |
| 3,900,943 | 8/1975 | Sirtl | 136/258 |
| 4,021,323 | 5/1977 | Kilby et al. | 29/572 |
| 4,027,053 | 5/1977 | Lesk | 427/86 |
| 4,173,494 | 11/1979 | Johnson et al. | 427/74 |
| 4,238,436 | 12/1980 | Hill | 427/86 |
| 4,330,358 | 5/1982 | Grabmaier | 156/603 |

FOREIGN PATENT DOCUMENTS

2508803 9/1976 Fed. Rep. of Germany .
2624756 12/1977 Fed. Rep. of Germany ........ 427/86

OTHER PUBLICATIONS

Fang et al., "Polycrystalline Silicon Films for Solar Cell Application", Applied Physics Letters, vol. 25, No. 10, Nov. 1974 (427–486).
Rosenblatt, "Energy Crisis Power Sources", Electronics, pp. 99-111 (Apr. 1974).

Primary Examiner—John D. Smith
Attorney, Agent, or Firm—Hill, Van Santen, Steadman, Chiara & Simpson

[57] ABSTRACT

Selectively shaped silicon crystal bodies, such as plate-, tape- or film-shaped bodies, having crystalline pillarlike structures therein are produced as substantially porefree bodies by forming a slurry from an admixture of relatively fine sized silicon particles, optional additives and a liquid binder, extruding such slurry as a relatively thin layer onto a first support member, drying such extruded layer until it becomes self-supporting and removing such support member, applying a substantially uniform layer of a germanium powder onto a surface of such self-supporting layer and then sintering the resultant structure in a protective gas atmosphere at temperatures below about 1430° C. until a layer of crystalline silicon particles is generated, which particles have an average diameter substantially corresponding to the thickness of the dried layer.

4 Claims, 2 Drawing Figures

METHOD FOR PRODUCING PLATE-, TAPE- OR FILM-SHAPED SI CRYSTAL BODIES FOR SOLAR CELLS

CROSS-REFERENCE TO RELATED APPLICATION

Attention is directed to co-pending C. Grabmaier et al application for patent, Ser. No. 160,214, filed June 17, 1980, now U.S. Pat. No. 4,330,358 assigned to the instant assignee and incorporated herein by reference.

BACKGROUND OF THE INVENTION

1. Field of the Invention

The invention relates to a process of producing silicon bodies for solar cells and somewhat more particularly to an improved process for producing plate-, tape-, or film-shaped Si crystal bodies having crystalline pillar-like structures therein, which are equivalent to crystalline columnar structures, and which bodies are useful for further processing into large-surface solar cells.

2. Prior Art

The process disclosed in the above-referenced Grabmaier et al application relates to manufacture of plate-shaped or tape-shaped Si crystal bodies having crystalline pillar-like structures therein, equivalent to crystalline columnar structures, and which bodies are useful, preferably for processing into solar cells.

As is known from prior art publications, a number of methods for producing Si crystal bodies for solar cells are known. However, these methods are typically too costly, in particular because they require sawing of a Si body produced in accordance with conventional crystal growth techniques, which are known per se, to an appropriate crystal disc required for solar cells.

The earlier referenced Grabmaier et al application discloses a process for producing Si crystal bodies which, during the manufacture thereof, are already in the form of plates, tapes or films and have crystalline pillar-like structures therein, equivalent to crystalline columnar structures, so that such bodies can readily be further processed to completion into finished large-surface solar cells. The Grabmaier et al process occurs without melting of the base or starting materials forming the Si bodies. The starting materials comprise a Si powder having an average particle diameter in the range of less than about 1 $\mu$m, which is admixed with a suitable binder, such as aqueous polyvinyl alcohol, and optional additives, to form a slurry. This slurry is extruded onto an inert support member as a relatively thin film or the like via an extrusion means, such as a doctor-blading tool, dried in air so as to form a self-supporting layer so that the support can be removed. The dried slurry layer is then placed on a temperature-resistant inert base and sintered in a protective gas atmosphere at a sintering temperature below about 1430° C. in such a manner that a layer or film is generated having monocrystalline silicon particles therein with an average particle diameter corresponding to the thickness of the sintered layer. In certain embodiments of this Grabmaier et al process, sintering aids, such as germanium, can be added to the silicon powder in an amount up to a maximum of about 5% by weight. Further, during sintering, the heat distribution within the sintering furnace is preferably so adjusted that a temperature gradient is attained in the thickness direction of the film or layer being sintered. The support base for the sintering step is preferably composed of quartz glass and is provided with a periodic spacing of crystallization seed centers which promote formation of the desired crystalline pillar structures. Such seed centers can be peak-shaped elevations uniformly spaced at intervals matched to the desired crystalline columnar or pillar structures of the silicon material. Select dopants, for example, arsenic and/or boron, along with any sintering aids, in the form of an arsenic-containing or boron-containing germanium alloy, can be added during slurry formation so as to be substantially uniformly distributed throughout the formed Si crystalline body. Such doped Si bodies are especially useful for fabrication into solar cells.

The manufacturing process disclosed in the above referenced Grabmaier et al application is particularly economical when work is carried out in a continuous manner whereby during extrusion of the silicon layer or film with a stationary extrusion shoe (or doctor-blading tool), the underlying support base is moved in a given direction at a preselected speed. Prior to actual sintering, the extruded tape-shaped silicon layer or film can be divided into individual plates or tiles corresponding to desired dimensions of solar cells to be produced therefrom. In this manner, not only is sawing of elongated crystalline Si bodies into discs or plates eliminated, but also the division of such body into Si plates of a select size can occur prior to sintering.

In the foregoing process, sintering of the Si slurry layer into Si crystalline bodies occurs at temperatures below the melting point of Si (1430° C.). Under these conditions and with appropriate heat distribution within the sintering furnace, larger crystals grow at the expense of smaller crystals at an orientation essentially parallel to the thickness dimension of the Si layer. The same effect can also be attained with the aid of a support member composed, for example, of quartz glass, and having the earlier described periodicity of singularities, particularly peak-shaped elevations, which together with a suitably matched heat distribution, initiate crystal growth on the contact surface between the support member and the Si layer positioned thereon and favors the desired crystalline pillar or columnar structures in the thickness dimension of the Si layer.

SUMMARY OF THE INVENTION

The present invention provides an improved method of producing plate, tape or film-shaped Si bodies, relative to the earlier referenced Grabmaier et al process whereby the produced Si body is as free of pores as possible or is more densely sintered, relative to that obtainable via the earlier described Grabmaier et al process.

In accordance with the principles of the invention, the referenced Grabmaier et al process is improved by providing a layer of germanium powder on a dried Si slurry layer prior to sintering of such slurry layer.

In certain embodiments, a second dried Si slurry layer can be positioned on the germanium layer located on a first dried slurry layer so that such Si layers with the germanium layer between is sintered.

In other embodiments, a plurality of Si layers to be sintered are positioned one on top of another to define a stack and a layer of germanium powder is provided between either each pair of Si layers or between each adjacent Si layer in such stack and the resultant stack structure is then commonly sintered.

DESCRIPTION OF PREFERRED EMBODIMENTS

Figure 1:
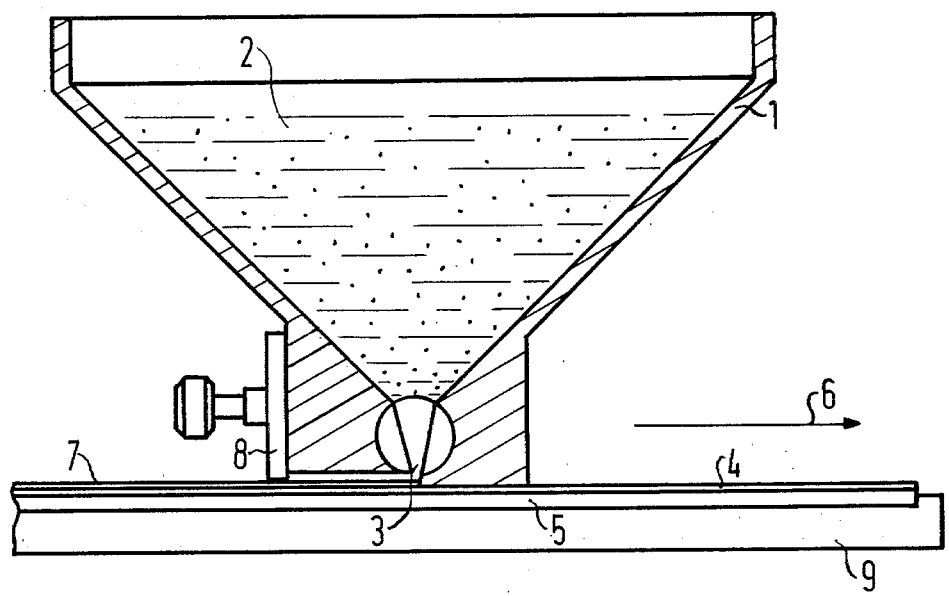
FIG. 1 is an elevated, partially cross-sectioned and somewhat schematic view of an apparatus arrangement useful for practicing the invention.

FIG. 1 illustrates, in principle, a layer extruding means or doctor-blading tool useful in practicing the earlier-referenced Grabmaier et al process and which is generally known for manufacture of electro-ceramics.

A funnel 1, having an adjustable outlet valve 3, is provided with a silicon slurry 2, for example, attained by admixing about 50 grams of silicon powder (having particles with an average grain diameter less than about 1 $\mu$m) with about 30 cubic centimeter of aqueous polyvinyl alcohol (about 5% polyvinyl alcohol, by volume). The silicon slurry can also contain sintering aids which, for example, contain up to a maximum of about 5% by weight germanium (based on the total weight of silicon particles in the slurry) and which can also contain a select dopant for a desired doping of the ultimately attained silicon body. For example, such dopant-sintering aids can comprise arsenic-containing germanium alloys or boron-containing germanium alloys. The slurry 2 is extruded or exits from funnel 1 via an adjustable outlet valve 3 which, for example, can be adjusted to provide an opening of about 0.4 mm, onto a first inert support member. In an exemplary embodiment, the support member comprises a glass plate 5 coated with a 300 $\mu$m thick Hostaphan (a commercially available polyethylene terephthalate) film. The first inert support member is positioned within an under-part or base 9 associated with the doctor-blading tool and the upper part of this tool is controllably moveable in the direction of arrow 6 so that a slurry layer 7 in a thickness of about 150 $\mu$m is extruded or deposited on the upper surface of the support member. An adjustable doctor-blade means 8 can be provided to meter the slurry and insure the attainment of uniform layer thickness.

After drying in air or in an infrared heater, the slurry layer 7 becomes self-supporting and stable so that it is relatively easy to process further as required. After drying, the Hostaphan film 4 is removed from layer 7 and the now free, solidified silicon slurry layer is ready for sintering on a second inert temperature-stable support member, for example, composed of a quartz glass in a protective atmosphere, such as argon, at a temperature of about 1350° C. for at least about 15 minutes. During sintering, the relatively small silicon particles having a diameter of less than about 1 $\mu$m, consolidate and become so large that particles having a diameter larger than the slurry layer thickness (150 $\mu$m) are attained. This grain growth can be controlled by the sintering aids mentioned earlier, which are present in the slurry undergoing sintering, as a liquid phase. It will be appreciated that such sintering aids must be distributed as homogeneously as possible in the slurry material. In instances where a dopant is added along with a sintering aid, both of which are admixed with the silicon particles and liquid binder to form a substantially homogeneous slurry, the distribution coefficient of such dope is higher in the liquid phase than in the growing silicon particles so that an enrichment of the dopant is attained at the growing grain or particle boundaries. In this manner, a substantially homogeneous distribution of the dopant is attained within the silicon layer which is formed from such slurry. In an exemplary embodiment, when n-doped silicon bodies are desired, an arsenic-containing germanium alloy (having a maximum of about 1% by weight of As therein) is added to the slurry material and when p-doped silicon bodies are desired, a boron-containing germanium alloy (having a maximum of about 1% by weight of B therein) is added to the slurry material. Such bodies can be produced in a select random size and p-n junctions can be attained therein by diffusing-in a dopant of the opposing conductivity type.

The principles of the invention, when combined with the above teachings, provide the process of producing sintered silicon films for solar cells which are, essentially, pore-free.

The present invention comprises an extension of utilizing germanium as a sintering aid for dense sintering of Si layers produced from the earlier-described Si slurry, which can contain less than about 5 gram atomic percent of germanium therein.

Figure 2:
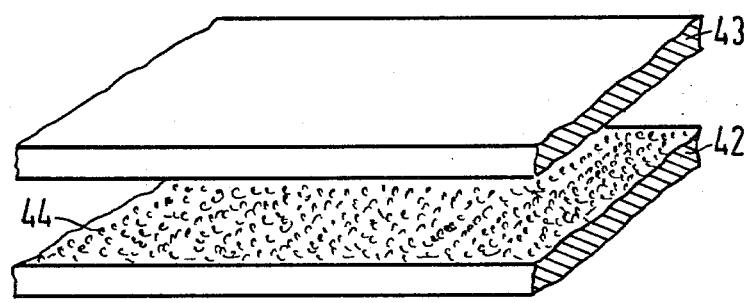
FIG. 2 is an elevated, partially cross-sectioned and somewhat schematic view of an exemplary embodiment of the invention.

In accordance with the principles of the invention, a germanium powder is distributed, as by sprinkling, onto an upper surface of a Si slurry layer as uniformly as possible and the resultant Si layer having powdered germanium thereon is then subjected to sintering as earlier described. An exemplary embodiment of this is illustrated at FIG. 2 wherein a Si slurry layer 42 is provided on its upper surface with a layer of germanium powder 44.

In preferred embodiments, a second similar Si slurry layer 43 can be positioned on top of the first Si layer 42, more precisely, on the germanium powder layer 44 positioned on layer 42. This stacked layer structure, comprised of layers 42, 44 and 43, which are in close proximity to one another, is then sintered on an inert, temperature-stable sintering support base at a select sintering temperature (below about 1430° C.). In certain instances, a weight or pressure-applying means can be provided on the upper surface of, for example, layer 43, so that the stacked structure (defined by layers 42, 44 and 43) does not buckle or otherwise become deformed during sintering.

In other embodiments of the invention, a plurality of Si layers, similar to layers 42 and 43, can be superimposed or stacked on on another to define a stack, in which between each two adjacent Si layers, a layer of germanium powder is provided, similar to that illustrated between layers 42 and 43. In other embodiments, a germanium powder layer, similar to layer 44, can be provided between each adjacent Si layer arranged in a stack of a desired thickness and such stack can then be subjected to common sintering conditions as described earlier.

The sintering occurs at such conditions that the germanium powder melts and at least partially alloys with Si of, for example, the Si layers 42 and 43 which do not melt at the sintering temperatures utilized. In other words, the respective surface layer of each Si layer in contact with the germanium powder layer forms a thin layer alloy of Si and Ge.

However, and surprisingly, the germanium layer 44 not only acts as a sintering aid by providing a molten phase which closes any pores in the adjacent Si layer, but it also functions as a separation means. Quite unexpectedly, two sintered Si layers, such as 42 and 43, can be readily separated from one another without difficulties, after completion of the sintering process or step, i.e., individual Si layers, sintered in a stack, can readily be separated from one another in a problem-free fashion.

As is apparent from the foregoing specification, the present invention is susceptible of being embodied with various alterations and modifications which may differ particularly from those that have been described in the preceding specification and description. For this reason, it is to be fully understood that all of the foregoing is intended to be merely illustrative and is not to be construed or interpreted as being restrictive or otherwise limiting of the present invention, excepting as it is set forth and defined in the hereto-appended claims.

We claim as our invention:

1. In a method of producing plate-, tape- or film-shaped Si crystal bodies having crystalline pillar structures therein, which are substantially equivalent to crystalline columnar structures, without melting of the base material which forms such Si bodies and which bodies are useful for further processing into large-surface solar cells, which include the steps of:
    (a) forming a slurry from an admixture of a Si powder having an average particle size in the range of less than about 1 μm, optional additives and a compatible liquid binder;
    (b) extruding such slurry with an extrusion means onto a first inert support member as a relatively thin slurry layer, which is dried into a self-supporting layer and removing the support member; and
    (c) sintering the self-supporting layer on a temperature-stable second inert support member in a protective gas atmosphere at a sintering temperature below about 1430° C. in such a manner that a layer of Si crystal particles is generated, each particle having an average particle diameter substantially corresponding to the thickness of the self-supporting layer;

the improvement comprising: coating said self-supporting Si slurry layer, prior to sintering, with a substantially uniform layer of germanium powder and subjecting the resultant layer structure to sintering in accordance with step (c).

2. In a method as defined in claim 1, wherein a second Si slurry layer is positioned on top of said germanium powder layer and the resultant pair of Si slurry layers with a germanium layer therebetween is subjected to sintering in accordance with step (c).

3. In a method as defined in claim 1, wherein a plurality of Si slurry layers are positioned on top of one another to define a stack of such layers, said germanium powder layer being provided between each pair of Si layers in such stack and said stack being subjected to sintering in accordance with step (c).

4. In a method as defined in claim 1, wherein a plurality of Si slurry layers are positioned on top of one another to define a stack of such layers, said germanium powder layer being provided between each Si layer in said stack and said stack being subjected to sintering in accordance with step (c).

* * * * *